United States Patent
Okamoto (10) Patent No.: US 6,897,007 B2
(45) Date of Patent: May 24, 2005

(54) METHOD FOR FORMING IMAGE (75) Inventor: Hideaki Okamoto, Kanagawa (JP)

(73) Assignee: Lastra S.p.A., Manerbio (IT)

( * ) Notice: Subject to any disclaimer, the term of this patent is extended or adjusted under 35 U.S.C. 154(b) by 100 days.

(21) Appl. No.: 10/098,598

(22) Filed: Mar. 18, 2002

(65) Prior Publication Data

US 2002/0177071 A1 Nov. 28, 2002

(30) Foreign Application Priority Data

Mar. 19, 2001 (JP) .......................................... 2001-077682

(51) Int. Cl.$^7$ .......................... G03F 7/028; G03F 7/032
(52) U.S. Cl. ........................ 430/302; 430/309; 430/348; 430/394; 430/434; 430/494; 430/944; 430/945
(58) Field of Search .......................... 430/270.1, 273.1, 430/281.1, 286.1, 287.1, 288.1, 302, 309, 348, 394, 401, 434, 494, 944, 945

(56) References Cited

U.S. PATENT DOCUMENTS

| | | | |
|---|---|---|---|
| 4,356,254 A | * 10/1982 | Takahashi et al. | 430/296 |
| 6,010,824 A | 1/2000 | Komano et al. | 430/281.1 |
| 6,232,038 B1 | * 5/2001 | Takasaki et al. | 430/281.1 |
| 6,455,230 B1 | * 9/2002 | Damme et al. | 430/302 |
| 6,509,132 B1 | * 1/2003 | Oohashi et al. | 430/270.1 |
| 6,558,875 B1 | * 5/2003 | Toshimitsu et al. | 430/302 |
| 2003/0118945 A1 | * 6/2003 | Okamoto | 430/302 |
| 2003/0157419 A1 | * 8/2003 | Miyakawa et al. | 430/108.6 |

FOREIGN PATENT DOCUMENTS

| | | |
|---|---|---|
| JP | 11-265069 | 9/1999 |
| JP | 2000-66416 | 3/2000 |
| JP | 2001-42546 | 2/2001 |

OTHER PUBLICATIONS

Derwent Abstract, AN 1999–605990 (52), XP–002201129, JP 11–265069, Sep. 28, 1999.
Patent Abstracts of Japan, JP 2000–066416, Mar. 3, 2000.
Patent Abstracts of Japan, JP 2000–089478, Mar. 31, 2000.
Patent Abstracts of Japan, JP 2000–267266, Sep. 29, 2000.
Patent Abstracts of Japan, JP 2001–154374, Jun. 8, 2001.

* cited by examiner

*Primary Examiner*—Barbara Gilliam
(74) *Attorney, Agent, or Firm*—Oblon, Spivak, McClelland, Maier & Neustadt, P.C.

(57) ABSTRACT

A method for forming an image, which comprises subjecting a photosensitive layer of a photosensitive lithographic printing plate having a photosensitive layer comprising a photopolymerizable composition formed on a support surface to scanning exposure with a laser light having a wavelength in a range of from 650 to 1,300 nm, developing an image, and then further subjecting the photosensitive lithographic printing plate having the developed image to whole image exposure with a light exposure energy of from 1 to 70 times larger than the light exposure energy at the time of the laser light scanning exposure.

14 Claims, 1 Drawing Sheet

METHOD FOR FORMING IMAGE

The present invention relates to a method for forming an image, which comprises exposing a photosensitive lithographic printing plate having a photosensitive layer comprising a photopolymerizable composition formed on a support surface to a laser light having a wavelength in a range of from 650 to 1,300 nm.

Heretofore, there has been commonly used a method for forming an image of a photosensitive lithographic printing plate having a photosensitive layer comprising a photopolymerizable composition, which comprises light-exposing the photosensitive layer of the photosensitive lithographic printing plate having the photosensitive layer comprising a photopolymerizable composition containing an ethylenic unsaturated compound formed on a support surface to polymerize and cure the ethylenic unsaturated compound in the photopolymerizable composition on the light-exposed part, and then dissolving and removing the unexposed part to form an image. However, as the light-exposing method, scanning exposure with a laser light such as an argon ion laser, an FD-YAG laser, a semiconductor laser, a YAG laser or the like, which provides a highly efficient productivity, has been noted, and among them, a semiconductor laser having an infrared wavelength range of from 650 to 1,300 nm has been favorably noted.

However, when the photopolymerizable composition is subjected to scanning exposure with the infrared laser light, the photopolymerizable composition having a high sensitivity is sensitized with a minute light leaked from a laser head to provide uneven images (causing "banding phenomenon"), and as this result, there is provided a problem that reproducibility of the image thus formed is poor. The banding phenomenon can be controlled and avoided if the infrared laser light output is made small, but it is difficult to form an image having such a sufficient strength as to provide a satisfactory printing resistance.

On the other hand, in the process of employing scanning exposure with an argon ion laser light having a wavelength of 488 nm or an FD-YAG laser light having a wavelength of 532 nm, it has been studied to improve an image strength by treatment after the scanning exposure. For example, a process comprising laser scanning exposure and whole image post-exposure after developing treatment or the like has been proposed (see U.S. Pat. No. 6,010,824, JP-A-11-265069 and JP-A-2001-42546). However, in order to improve an image strength by carrying out the whole image post-exposure after the developing treatment, it has been necessary to use a light exposure energy of about at least 100 times larger than a light exposure energy required at the time of scanning exposure with a laser light, as described in JP-A-2000-66416.

In view of the above-mentioned prior arts of forming an image by exposing a photopolymerizable photosensitive lithographic printing plate to an infrared laser light, an object of the present invention is to provide a method for forming an image by exposing a photopolymerizable photosensitive lithographic printing plate to an infrared laser light, which can produce such a sufficient image strength as to provide a satisfactory printing resistance and also can provide an excellent image-reproducibility.

As mentioned above, when carrying out scanning exposure with an infrared laser light, it was necessary to reduce a laser light output in order to prevent "banding phenomenon". When carrying out such scanning exposure with the infrared laser light, a light exposure energy required at the time of carrying out whole image exposure after development is required to be such a high level as at least 100 times larger than a light exposure energy required at the time of the scanning exposure, as described in the conventional prior arts.

However, the present inventors have intensively studied and discovered that the above object can be achieved by carrying out scanning exposure with an infrared laser light and further carrying out whole image exposure with a light exposure energy of at most 70 times larger than a light exposure energy required at the time of the scanning exposure with the infrared laser light, and the present invention has been accomplished on the basis of this discovery.

Thus, the first feature of the present invention resides in a method for forming an image, which comprises subjecting a photosensitive layer of a photosensitive lithographic printing plate having a photosensitive layer comprising a photopolymerizable composition formed on a support substrate to a laser light having a wavelength in a range of from 650 to 1,300 nm, developing an image and then further subjecting the developed printing plate to whole image exposure with a light exposure energy of at most 70 times larger than the light exposure energy required at the time of the scanning exposure with the laser light.

Also, the second feature of the present invention resides in an apparatus for forming an image, which comprises forming an image with the following continuously connected steps:

(1) a scanning exposure step of subjecting a photosensitive layer of a photosensitive lithographic printing plate having a photosensitive layer comprising a photopolymerizable composition formed on a support surface to scanning exposure with a laser light having a wavelength in a range of from 650 to 1,300 nm, (2) a developing step of developing an image of the printing plate after the scanning exposure, and (3) a whole image exposure step of subjecting the printing plate after the development to whole image exposure with a light exposure energy of at most 70 times larger than the light exposure energy at the time of the scanning exposure with the laser light used at the step (1)

A photopolymerizable composition as a photosensitive layer of a photosensitive lithographic printing plate of the present invention preferably contains the following components (A) to (D):

(A) an ethylenic unsaturated compound, (B) a sensitizing dye absorbing a light having a wavelength in a range of from 650 to 1,300 nm, (C) a photopolymerization initiator, and (D) a high molecular binder.

In the present invention, an ethylenic unsaturated compound as the component (A) constituting a preferable photopolymerizable composition is addition-polymerized by the action of a photopolymerization initiation system containing a photopolymerization initiator as the following described component (C) when the photopolymerizable composition is subjected to irradiation with an active light ray, and the ethylenic unsaturated compound is a compound having at least one radical-polymerizable ethylenic unsaturated bond in a molecule, which may be crosslinked and cured as the case requires.

The ethylenic unsaturated compound may be a compound having one ethylenic unsaturated bond in a molecule such as unsaturated carboxylic acids including (meth)acrylic acid (the term "(meth)acryl" means "acryl or methacryl", hereinafter the same), crotonic acid, isocrotonic acid, maleic acid, itaconic acid, citraconic acid or the like, and their alkyl esters, and (meth)acrylonitrile, (meth)acrylamide, styrene, and the like. When considering polymerizability and crosslinkability, and in connection therewith, considering to enlarge a difference in solubility in a developer between an exposed part and an unexposed part, it is preferable to use a compound having at least two ethylenic unsaturated bonds in a molecule, and it is particularly preferable to use an acrylate compound, the unsaturated bond of which is derived from a (meth)acryloyloxy group.

Typical examples of the compound having at least two ethylenic unsaturated bonds in a molecule include esters of an unsaturated carboxylic acid and a polyhydroxy compound, urethane(meth)acrylates of a hydroxy(meth) acrylate compound and a polyisocyanate compound, epoxy (meth)acrylates of a (meth)acrylic acid or a hydroxy(meth) acrylate compound and a polyepoxy compound, (meth) acryloyloxy group-containing phosphates, and the like.

Examples of the esters include reaction products of the above-mentioned unsaturated carboxylic acids with aliphatic polyhydroxy compounds such as ethylene glycol, diethylene glycol, triethylene glycol, tetraethylene glycol, propylene glycol, tripropylene glycol, trimethylene glycol, tetramethylene glycol, neopentyl glycol, hexamethylene glycol, nonamethylene glycol, trimethylolethane, tetramethylolethane, trimethylolpropane, glycerol, pentaerythritol, dipentaerythritol, sorbitol, and their ethylene oxide adducts, propylene oxide adducts, diethanolamine, triethanolamine or the like, and their particular examples include ethylene glycol di(meth)acrylate, diethylene glycol di(meth)acrylate, triethylene glycol di(meth)acrylate, tetraethylene glycol di(meth)acrylate, propylene glycol di(meth)acrylate, tripropylene glycol di(meth) acrylate, tetramethylene glycol di(meth)acrylate, neopentyl glycol di(meth)acrylate, hexamethylene glycol di(meth) acrylate, nonamethylene glycol di(meth)acrylate, trimethylolethane tri(meth)acrylate, tetramethylolethane tri(meth) acrylate, trimethylolpropane di(meth)acrylate, trimethylolpropane tri(meth)acrylate, trimethylolpropane ethylene oxide adduct tri(meth)acrylate, glycerol di(meth) acrylate, glycerol tri(meth)acrylate, glycerol propylene oxide adduct tri(meth)acrylate, pentaerythritol di(meth) acrylate, pentaerythritol tri(meth)acrylate, pentaerythritol tetra(meth)acrylate, dipentaerythritol di(meth)acrylate, dipentaerythritol tri(meth)acrylate, dipentaerythritol tetra (meth)acrylate, dipentaerythritol penta(meth)acrylate, dipentaerythritol hexa(meth)acrylate, sorbitol tri(meth) acrylate, sorbitol tetra(meth)acrylate, sorbitol penta(meth) acrylate, sorbitol hexa(meth)acrylate or the like, and their corresponding crotonate, isocrotonate, maleate, itaconate, citraconate, and the like.

Further examples of the esters include reaction products of the above-mentioned unsaturated carboxylic acids with aromatic polyhydroxy compounds such as hydroquinone, resorcin, pyrogallol, bisphenol F, bisphenol A or the like, particular example of which include hydroquinone di(meth) acrylate, resorcin di(meth)acrylate, pyrogallol tri(meth) acrylate or the like, reaction products of the above-mentioned unsaturated carboxylic acids with heterocyclic polyhydroxy compounds such as tris(2-hydroxyethyl) isocyanurate or the like, particular examples of which include tris(2-hydroxyethyl)isocyanurate di(meth)acrylate or tri(meth)acrylate, reaction products of unsaturated carboxylic acids with polyhydric carboxylic acids and polyhydroxy compounds, particular examples of which include a condensate of (meth)acrylic acid and phthalic acid, a condensate of (meth)acrylic acid, maleic acid and diethylene glycol, a condensate of (meth)acrylic acid, terephthalic acid and pentaerythritol, a condensate of (meth)acrylic acid, adipic acid, butanediol and glycerin, and the like.

Also, examples of the urethane (meth)acrylates include reaction products of hydroxy(meth)acrylate compounds such as hydroxymethyl(meth)acrylate, hydroxyethyl(meth) acrylate, glycerol di(meth)acrylate, pentaerythritol tri(meth) acrylate, tetramethylolethane tri(meth)acrylate, or the like, with polyisocyanate compounds such as aliphatic polyisocyanates including hexamethylene diisocyanate, 2,4,4-trimethylhexamethylene diisocyanate, lysine methyl ester diisocyanate, lysine methyl ester triisocyanate, dimer acid diisocyanate, 1,6,11-undecatriisocyanate, 1,3,6-hexamethylene triisocyanate, 1,8-diisocyanate-4-isocyanate methyloctane or the like, cycloaliphatic polyisocyanates including cyclohexane diisocyanate, dimethylcyclohexane diisocyanate, 4,4'-methylenebis(cyclohexyl isocyanate), isophorone diisocyanate, bicycloheptane triisocyanate or the like, aromatic polyisocyanates including p-phenylene diisocyanate, 2,4-tolylene diisocyanate, 2,6-tolylene diisocyanate, xylylene diisocyanate, tetramethylxylylene diisocyanate, 4,4'-diphenylmethane diisocyanate, tolidine diisocyanate, 1,5-naphthalene diisocyanate, tris (isocyanatephenylmethane), tris(isocyanatephenyl) thiophosphate or the like, or heterocyclic polyisocyanates including isocyanurate or the like.

Also, examples of the epoxy(meth)acrylates include reaction products of (meth)acrylic acid or the above-mentioned hydroxy(meth)acrylate compounds with polyepoxy compounds such as aliphatic polyepoxy compounds including (poly)ethylene glycol polyglycidyl ether, (poly)propylene glycol polyglycidyl ether, (poly)tetramethylene glycol polyglycidyl ether, (poly)pentamethylene glycol polyglycidyl ether, (poly)neopentyl glycol polyglycidyl ether, (poly) hexamethylene glycol polyglycidyl ether, (poly) trimethylolpropane polyglycidyl ether, (poly)glycerol polyglycidyl ether, (poly)sorbitol polyglycidyl ether or the like, aromatic polyepoxy compounds including a phenol novolac polyepoxy compound, a bromated phenol novolac polyepoxy compound, a (o-, m-, p-)cresol novolac polyepoxy compound, a bisphenol A polyepoxy compound, a bisphenol F polyepoxy compound or the like, or heterocyclic polyepoxy compounds including sorbitan polyglycidyl ether, triglycidyl isocyanurate, triglycidyl tris(2-hydroxyethyl)isocyanurate or the like.

Also, examples of the (meth)acryloyloxy group-containing phosphates including preferably compounds represented by the following formulae (Ia) or (Ib).

(In the formulae (Ia) and (Ib), $R^{21}$ is a hydrogen atom or a methyl group, n is an integer of from 1 to 25, and m is 1, 2 or 3.)

In the above formulae, n is preferably from 1 to 10, particularly from 1 to 4, and examples of their compounds include (meth)acryloyloxyethyl phosphate, bis[(meth) acryloyloxyethyl]phosphate, (meth)acryloyloxyethylene glycol phosphate, or the like, and they may be used respectively alone or in a mixture.

Also, in addition to the above compounds, examples of other ethylenic unsaturated compounds include (meth) acrylamides such as ethylenebis(meth)acrylamide or the like, allyl esters such as diallyl phthalate or the like, and vinyl group-containing compounds such as divinyl phthalate or the like. These ethylenic unsaturated compounds may be used respectively alone or in a mixture of two or more.

In the present invention, in view of exposure sensitivity, printing resistance and developing properties, it is preferable to use the above-mentioned (meth)acryloyloxy group-containing phosphates as an ethylenic unsaturated compound of the component (A), and the content of the phosphates in the total ethylenic unsaturated compounds of the component (A) is preferably from 1 to 60 wt %, more preferably from 5 to 50 wt %.

Also, a sensitizing dye of the component (B) constituting a preferable photopolymerizable composition in the present invention can efficiently absorb a light in the infrared zone, particularly in a wavelength range of from 650 to 1,300 nm, transferring its photo-excitation energy to a photopolymerization initiator of the component (c), decomposing the photopolymerization initiator, and promoting a sensitizing function of generating an active radical inducing polymerization of an ethylenic unsaturated compound of the component (A).

In the present invention, the sensitizing dye has a structure having a hetero atom such as a nitrogen atom, an oxygen atom or a sulfur atom bonded with a polymethine (—CH=)$_n$ chain, and is a typically widely defined cyanine type dye having a basic structure wherein the hetero atoms form heterocyclic rings which are bonded by way of a polymethine chain. Examples of the sensitizing dye include quinoline type (so-called cyanine type), indole type (so-called indocyanine type), benzothiazole type (so-called thiocyanine type), pyririum type, thiopyririum type, squaririum type, croconium type or azulenium type dyes, and so-called polymethine type dyes having a basic structure having non-cyclic hetero atoms bonded by way of a polymethine chain. Among them, cyanine type dyes such as quinoline type, indole type, benzothiazole type, pyririum type or thiopyririum type dyes, and polymethine type dyes are preferable.

In the present invention, among the above-mentioned cyanine type dyes, dyes expressed by the following formula (IIa), (IIb) or (IIc) are particularly preferable as a quinoline type dye.

(IIa)

(IIb)

(IIc)

(In the above formulae (IIa), (IIb) and (IIc), $R^1$ and $R^2$ are respectively independently an alkyl group which may have a substituent, an alkenyl group which may have a substituent, an alkynyl group which may have a substituent or a phenyl group which may have a substituent, $L^1$ is a tri-, penta-, hepta-, nona- or undeca-methine group which may have a substituent, and two substituents on the penta-, hepta-, nona- or undeca-methine group may be connected to each other to form a $C_{5-7}$ cycloalkene ring, and a condensed benzene ring may have a substituent, and in such a case, adjacent two substituents may be connected to each other to form a condensed benzene ring. $X_1^-$ is a counter anion.)

With respect to $R^1$ and $R^2$ in the formulae (IIa), (IIb) and (IIc), a carbon number of an alkyl group is generally from 1 to 15, preferably from 1 to 10, and a carbon number of an alkenyl group or an alkynyl group is generally from 2 to 15, preferably from 2 to 10, and examples of substituents of these groups and a phenyl group include a $C_{1-15}$, preferably $C_{1-10}$ alkoxy group, a phenoxy group, a hydroxy group or a phenyl group, and examples of substituents of $L^1$ and a condensed benzene ring include an alkyl group having the same carbon number as mentioned above, and the like.

Also, preferable examples of indole type and benzothiazole type dyes include dyes expressed by the following formula (III).

(III)

(In the above formula (III), $Y^1$ and $Y^2$ are respectively independently a dialkylmethylene group or a sulfur atom; $R^3$ and $R^4$ are respectively independently an alkyl group which may have a substituent, an alkenyl group which may have a substituent, an alkynyl group which may have a substituent or a phenyl group which may have a substituent; $L^2$ is a tri-, penta-, hepta-, nona- or undeca-methine group, and two substituents on the penta-, hepta-, nona- or undeca-methine group may be connected to each other to form a $C_{5-7}$ cycloalkene ring; and a condensed benzene ring may have a substituent, and in such a case, adjacent two substituents may be connected to each other to form a condensed benzene ring. $X_a^-$ is a counter anion.)

With respect to $R^3$ and $R^4$ in the formula (III), a carbon number of an alkyl group is generally from 1 to 15, preferably from 1 to 10, and a carbon number of an alkenyl group or an alkynyl group is generally from 2 to 15, preferably from 2 to 10, and examples of substituents of these groups and a phenyl group include a $C_{1-15}$, preferably $C_{1-10}$ alkoxy group, a phenoxy group, a hydroxy group or a phenyl group, and examples of substituents of $L^2$ and a condensed benzene ring include an alkyl group having the same carbon number as mentioned above, and the like.

Also, preferable examples of pyririum type and thiopyririum type dyes include dyes expressed by the following formula (IVa), (IVb) or (IVc).

(In the above formulae (IVa), (IVb) and (IVc), $Z^1$ and $Z^2$ are respectively independently an oxygen atom or a sulfur atom; $R^5$, $R^6$, $R^7$ and $R^8$ are respectively independently a hydrogen atom or an alkyl group, or $R^5$ and $R^7$, and $R^6$ and $R^8$ respectively may be connected to each other to form a $C_5$ or $C_6$ cycloalkene ring; $L^3$ is a mono-, tri-, penta-, or hepta-methine group which may have a substituent, and two substituents on the tri-, penta- or hepta-methine group may be connected to each other to form a $C_{5-7}$ cycloalkene ring; and a pyririum ring and a thiopyririum ring may have a substituent, and in such a case, adjacent two substituents may be connected to each other to form a condensed benzene ring. $X_a^-$ is a counter anion.)

In the above formulae (IVa), (IVb) and (IVc), an alkyl group of $R^5$, $R^6$, $R^7$ and $R^8$ has usually a carbon number of from 1 to 15, preferably from 1 to 10; examples of a substituent of $L^3$ include an alkyl group having the same carbon number as above, and the like; and examples of substituents of a pyririum ring and a thio pyririum ring include an aryl group such as a phenyl group or the like.

Also, preferable examples of a polymethine type dye include dyes expressed by the following formula (V).

(In the above formula (V), $R^9$, $R^{10}$, $R^{11}$ and $R^{12}$ are respectively independently an alkyl group, and $R^{13}$ and $R^{14}$ are respectively independently an aryl group which may have a substituent, a furyl group or a thienyl group; $L^4$ is a mono-, tri-, penta- or hepta-methine group which may have a substituent, and two substituents on the tri-, penta- or hepta-methine group may be connected to each other to form a $C_{57}$ cycloalkene ring; and a quinone ring and a benzene ring may have a substituent. $X^-$ is a counter anion.)

In the above formula (V), an alkyl group of $R^9$, $R^{10}$, $R^{11}$ and $R^{12}$ has usually a carbon number of from 1 to 15, preferably from 1 to 10; an aryl group of $R^{13}$ and $R^{14}$ has usually a carbon number of from 6 to 20, preferably from 6 to 15, and preferable examples of $R^{13}$ and $R^{14}$ include a phenyl group, a 1-naphtyl group, a 2-naphtyl group, a 2-furyl group, a 3-furyl group, a 2-thienyl group and a 3-thienyl group, and examples of their substituents include an alkyl group having the same carbon number as above, an alkoxy group having the same carbon number as above, a dialkylamino group, a hydroxy group or a halogen atom; and examples of substituents of $L^4$, a quinone ring and a benzene ring include an alkyl group having the same carbon number as above, and the like.

Also, examples of a counter anion $X_a^-$ in the above formulae (IIa to IIc), (III), (IVa to IVc) and (V), include inorganic acid anions such as $Cl^-$, $Br^-$, $I^-$, $ClO_4^-$, $PF_6^-$, $SbF_6^-$, $AsF_6^-$, and inorganic boric acids such as $BF_4^-$, $BC_4^-$ or the like, and organic acid anions such as benzene sulfonic acid, toluene sulfonic acid, naphthalene sulfonic acid, acetic acid and organic boric acids having an organic group such as methyl, ethyl, propyl, butyl, phenyl, methoxyphenyl, naphthyl, fluorophenyl, difluorophenyl, pentafluorophenyl, thienyl, pyrrolyl or the like.

Also, in the above formulae (IIa to IIc), (III), (IVa to IVc) and (V), a polymethine chain of $L^1$, $L^2$, $L^3$ and $L^4$ may preferably have a barbituric acid anion group or a thiobarbituric acid anion group expressed by the following formula (VI), as a substituent to form an internal salt, or a polymethine chain of $L^1$, $L^1$ $L^3$ and $L^4$ may preferably form a squaric acid anion group or a thiosquaric acid anion group expressed by the following formula (VII), or a croconic acid anion group or a thiocroconic acid anion group expressed by the following formula (VIII), to form an internal salt. (In this case, an external anion is not necessary.)

(In the above formulae (VI), (VII) and (VIII), $Z^3$, $Z^4$, $Z^5$ $Z^6$, $Z^7$ and $Z^8$, are respectively independently an oxygen atom or a sulfur atom, and $R^{15}$ and $R^{16}$ are respectively independently a hydrogen atom, an alkyl group which may have a substituent, an alkenyl group which may have a substituent, an alkoxy group which may have a substituent or a phenyl group which may have a substituent.)

With regard to $R^{15}$ and $R^{16}$ of the above formula (VI), an alkyl group or an alkoxy group has usually a carbon number of from 1 to 15, preferably from 1 to 5, and an alkenyl group has usually a carbon number of from 2 to 15, preferably from 2 to 5, and among them, an alkyl group is preferable, particular examples of which include a methyl group, an ethyl group, a propyl group or a butyl group.

Also, with regard to the polymethine chain of $L^1$, $L^2$, $L^3$ and $L^4$ in the formulae (IIa to IIc), (III), (IVa to IVc) and (V), a hepta-methine chain is preferable to a wavelength range of from 700 to 850 nm, and a nona-methine chain is preferable to a wavelength range of from 850 to 950 nm, and an undeca-methine chain is preferable to a wavelength range of from 950 to 1,300 nm.

Among quinoline type dyes expressed by the above formulae (IIa to IIc), an indole type or benzothiazole type dye expressed by the above formula (III), cyanine type dyes such as pyririum type or thiopyririum type dye expressed by the above formulae (IVa to IVc), and a polymethine type dye expressed by the above formula (V), an indole type or benzothiazole type dye expressed by the above formula (III) are particularly preferable in the present invention.

Also, a photopolymerization initiator of the component (C) constituting a preferable photopolymerizable composition in the present invention is a radical-generating agent generating an active radical in the presence of a sensitizing dye of the component (B) when irradiated with light. Examples of the photopolymerization initiator include halogenated hydrocarbon derivatives, organic borates (as disclosed in JP-A-62-143044, JP-A-62-150242, JP-A-9-188685, JP-A-9-188686, JP-A-9-188710, U.S. Patent No. 2,764,769, and "Rad Tech '98. Proceeding Apr. 19–22, 1998, Chicago" by Kunz, Martin), titanocene compounds (as disclosed in JP-A-59-152396 and JP-A-61-151197), hexaarylbiimidazol compounds (as disclosed in JP-B-6-29285), and diaryl iodonium salts, organic peroxides, and the like. In the present invention, halogenated hydrocarbon derivatives and organic borates are particularly preferable.

Examples of the halogenated hydrocarbon derivatives include preferably a s-triazine compound having at least one mono-, di-, or trihalogen-substituted methyl group bonded to a s-triazine ring, particular examples of which include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(p-methoxynaphthyl)-4,6-bis(trichloromethyl)-s-triazine, 2-(p-ethoxynaphthyl)-4,6-bis(trichloromethyl)-s-triazine, 2-(p-ethoxycarbonylnaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and the like. Among them, bis(trihalomethyl)-s-triazine compounds such as 2-methyl-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine or the like are preferable since they provide a photopolymerizable composition excellent in stability with time.

Also, examples of other halogenated hydrocarbon derivatives are illustrated in JP-A-53-133428, JP-A-62-58241, German Patent No. 3337024, and "Journal of Heterocyclic Chemistry" by M. P.Hutt,E. F.Flslager,L. M.Werbel, Vol. 7, No. 3 (1970).

Also, preferable examples of the organic borates include a compound expressed by the following formula (IX).

(In the above formula (IX), $R^{17}$, $R^{18}$, $R^{19}$ and $R^{20}$ are respectively independently an alkyl group which may have a substituent, an alkenyl group which may have a substituent, an alkynyl group which may have a substituent, an aryl group which may have a substituent or a heterocyclic group, and they may be connected to each other to form a cyclic structure, and at least one of them is an alkyl group which may have a substituent. $X_b^+$ is a counter cation.)

With respect to $R^{17}$, $R^{18}$, $R^{19}$ and $R^{20}$ in the above formula (IX), an alkyl group has usually a carbon number of from 1 to 15, preferably from 1 to 5, and an alkenyl group or an alkynyl group has usually a carbon number of from 2 to 15, preferably from 2 to 5, and an aryl group has usually a carbon number of from 6 to 20, preferably from 6 to 15, and a heterocyclic group has usually a carbon number of from 4 to 20, preferably from 4 to 15, and examples of a substituent for these groups include a halogen atom, an alkyl group, an alkoxy group, a trifluoromethyl group, a trimethyl silyl group and the like.

Examples of an organic boron anion of an organic borate expressed by the formula (IX) include n-butyl-methyl-diphenyl boron anion, n-butyl-triphenyl boron anion, n-butyl-tris(2,4,6-trimethylphenyl)boron anion, n-butyl-tris(p-methoxyphenyl)boron anion, n-butyl-tris(p-fluorophenyl)boron anion, n-butyl-tris(m-fluorophenyl) boron anion, n-butyl-tris(3-fluoro-4-methylphenyl)boron anion, n-butyl-tris(2,6-difluorophenyl)boron anion, n-butyl-tris(2,4,6-trifluorophenyl)boron anion, n-butyl-tris(2,3,4,5,6-pentafluorophenyl)boron anion, n-butyl-tris(p-chlorophenyl)boron anion, n-butyl-tris(trifluoromethyl) boron anion, n-butyl-tris(2,6-difluoro-3-pyrrolylphenyl)-boron anion, and the like.

Also, examples of a counter cation $X_b^+$ include an onium compound such as iodonium cation, sulfonium cation, phosphonium cation, ammonium cation or alkali metal cation, and pyrririum cation, thiopyrririum cation, indolium cation, and the like, and an organic ammonium cation such as tetraalkyl ammonium is particularly preferable.

Also, in the present invention, as a method for making a sensitizing dye of the above component (B) and an organic borate photopolymerization initiator of the above component (C) present in the photopolymerizable composition, there are an ordinary method for blending a salt of a dye cation of the above sensitizing dye and an optionally selected counter anion with a salt of an organic boron anion of the above organic borate and an optionally selected counter cation, and a method for blending a salt formed from a dye cation of the above sensitizing dye and an organic boron anion of the above organic borate, and the latter method is preferable.

Also, a high molecular binder of the component (D) constituting a preferable photopolymerizable composition of the present invention, has a function as a binder for an ethylenic unsaturated compound of the component (A), a sensitizing dye of the component (B) and a photopolymerization initiator of the component (C), and examples of the high molecular binder include a homo- or co-polymer of (meth)acrylic acid, (meth)acrylic acid ester, (meth) acrylonitrile, (meth)acrylamide, maleic acid, styrene, vinyl acetate, vinylidene chloride, maleimide or the like, and polyamide, polyester, polyether, polyurethane, polyvinyl butyral, polyvinyl pyrrolidone, polyethylene oxide, acetyl cellulose, and the like. Among them, a carboxyl group-containing polymer is preferable in view of alkali-developing properties, and concrete examples include a copolymer containing (meth)acrylic acid and (meth)acrylic acid alkyl ($C_{1-10}$) ester, or further styrene, as copolymerizing components, and preferably this carboxyl group-containing polymer has an acid value of from 10 to 250 and a weight average molecular weight of from 0.5 to 1,000,000.

Further, a preferable high molecular binder has an ethylenic unsaturated bond in a side chain, and the ethylenic unsaturated bond is preferably expressed by the following formula (Xa), (Xb) or (Xc).

(In the above formulae (Xa), (Xb) and (Xc), $R^{22}$ is a hydrogen atom or a methyl group, $R^{23}$, $R^{24}$, $R^{25}$, $R^{26}$ and $R^{27}$ are respectively independently a hydrogen atom, a halogen atom, an amino group, a dialkylamino group, a carboxyl group, an alkoxycarbonyl group, a sulfo group, a nitro group, a cyano group, an alkyl group which may have a substituent, an alkoxy group which may have a substituent, an alkylamino group which may have a substituent, an alkylsulfonyl group which may have a substituent, an aryl group which may have a substituent, an aryloxy group which may have a substituent, an arylamino group which may have a substituent, or an arylsulfonyl group which may have a substituent, and $Z^9$ is an oxygen atom, a sulfur atom, an imino group or an alkylimino group.

Examples of substituents for an alkyl group, an alkoxy group, an alkylamino group, an alkylsulfonyl group, an aryl group, an aryloxy group, an arylamino group and an arylsulfonyl group in $R^{23}$ to $R^{27}$ include an alkyl group, an alkoxy group, an alkylthio group, an amino group, a dialkylamino group, a nitro group, a cyano group, a phenyl group, a halogen atom, and the like.

A high molecular binder having an ethylenic unsaturated bond in a side chain expressed by the above formula (Xa) is obtained by reacting a carboxyl group-containing polymer with an aliphatic epoxy group-containing unsaturated compound such as allylglycidyl ether, glycidyl(meth)acrylate, α-ethylglycidyl(meth)acrylate, glycidyl crotonate, glycidyl isocrotonate, crotonylglycidyl ether, itaconic acid monoalkyl monoglycidyl ester, fumaric acid monoalkyl monoglycidyl ester, maleic acid monoalkyl monoglycidyl ester or the like, or a cycloaliphatic epoxy group-containing unsaturated compound such as 3,4-epoxycyclohexylmethyl (meth)acrylate, at a temperature of about 80 to 120° C. for about 1 to 50 hours, so as to react from 5 to 90 mol %, preferably from 30 to 70 mol %, of the carboxyl group of the carboxyl group-containing polymer.

Also, a high molecular binder having an ethylenic unsaturated bond in a side chain expressed by the above formula (Xb) is obtained by copolymerizing a compound having at least two kinds of unsaturated groups such as allyl(meth) acrylate, 3-allyloxy-2-hydroxypropyl(meth)acrylate, cinnamyl(meth)acrylate, crotonyl(meth)acrylate, methallyl (meth)acrylate, N,N-diallyl(meth)acrylamide or the like, with an unsaturated carboxylic acid such as (meth)acrylic acid or an unsaturated carboxylic acid ester, so as to include the former unsaturated group-containing compound in an amount of from 10 to 90 mol %, preferably from 30 to 80 mol %, in the total copolymer.

Also, a high molecular binder having an ethylenic unsaturated bond in a side chain expressed by the above formula (Xc) is obtained by copolymerizing a compound having at least two kinds of unsaturated groups such as vinyl(meth) acrylate, 1-chlorovinyl(meth)acrylate, 2-phenylvinyl(meth) acrylate, 1-propenyl(meth)acrylate, vinyl crotonate, vinyl (meth)acrylamide or the like with an unsaturated carboxylic acid such as (meth)acrylic acid or an unsaturated carboxylic acid ester, so as to include the former unsaturated group-containing compound in an amount of from 10 to 90 mol %, preferably from 30 to 80 mol %, in the total copolymer.

With regard to respective contents of the ethylenic unsaturated compound of the component (A), the sensitizing dye of the component (B), the photopolymerization initiator of the component (C) and the high molecular binder of the component (D) in a preferable photopolymerizable composition of the present invention, the preferable photopolymerizable composition contains the sensitizing dye of the component (B) in an amount of preferably from 0.01 to 20 parts by weight, more preferably from 0.05 to 10 parts by weight, the photopolymerization initiator of the component (C) in an amount of preferably from 0.1 to 80 parts by weight, more preferably from 0.5 to 60 parts by weight, and the high molecular binder of the component (D) in an amount of preferably from 10 to 400 parts by weight, more preferably from 20 to 200 parts by weight, to 100 parts by weight of the ethylenic unsaturated compound of the component (A).

Further, the photopolymerizable composition of the present invention may contain various additives such as a heat polymerization-preventing agent such as hydroquinone, t-methoxyphenol, 2,6-di-t-butyl-p-cresol or the like in an amount of at most 2 parts by weight to 100 parts by weight of the ethylenic unsaturated compound of the component (A), a coloring agent such as an organic or inorganic dye or pigment in an amount of at most 20 parts by weight to 100 parts by weight of the ethylenic unsaturated compound of the component (A), a plasticizer such as dioctyl phthalate, didodecyl phthalate, tricresyl phosphate or the like in an amount of at most 40 parts by weight to 100 parts by weight of the ethylenic unsaturated compound of the component (A), a sensitivity-improving agent such as tertiary amine or thiol, a coating property-improving agent such as a surfactant including a fluorine type surfactant, or a development-accelerator, in an amount of at most 10 parts by weight to 100 parts by weight of the ethylenic unsaturated compound of the component (A), or a dye precursor in an amount of 30 parts by weight to 100 parts by weight of the ethylenic unsaturated compound of the component (A).

A photosensitive lithographic printing plate used in an image-forming process of the present invention is produced by preparing a coating solution of the above-mentioned photopolymerizable composition by appropriately dissolving or dispersing the above-mentioned respective components in an appropriate solvent, coating the coating solution on the surface of a support, heating and drying to form a photosensitive layer comprising the above photopolymerizable composition on the surface of the support.

Examples of the support for the photosensitive lithographic printing plate of the present invention include well known supports used in a photosensitive lithographic printing plate, such as a metal plate, a synthetic resin film or the like, but a preferable example is an aluminum plate or an aluminum alloy plate of an aluminum alloy with silicon, copper, manganese, magnesium, chromium, zinc, lead, bismuth or nickel, and the plate preferable has a thickness of usually from 0.05 to 1 mm. Also, the aluminum or aluminum alloy plate is used usually after having the surface subjected to a surface-roughening treatment and then anodizing treatment.

Examples of the surface-roughening treatment (sandblasting treatment) include mechanical treating methods such as a brush polishing method, a ball polishing method, a blast polishing method, a hydro-honing polishing method, or a buff polishing method, or an electrolytic etching method, chemical etching method or other commonly used methods, but among them, a brush polishing method, a ball polishing method, a hydro-honing polishing method, electrolytic etching method, or a chemical etching method is preferable, and particularly, it is preferable to employ an electrolytic etching method carrying out electrolysis by alternating current or direct current in a hydrochloric acid or nitric acid electrolyte having an acid density of about 0.5 to 5 wt % at an electric current density of about 20 to 200 A/dm$^2$ under an electric voltage of about 10 to 40 V at a temperature of about 20 to 50° C. Also, after the surface-roughening treatment, a desmut treatment with an acid or alkali aqueous solution may be carried out, if necessary.

The anodizing treatment is usually conducted by carrying out electrolysis using an aluminum plate as an anode and using sulfuric acid alone or an aqueous solution containing mainly sulfuric acid together with oxalic acid, phosphoric acid, chromic acid or malonic acid at an acid concentration of from 5 to 50 wt %, preferably from 15 to 30 wt %, at an electric current density of from 1 to 60 A/dm$^2$ under an electric voltage of from 1 to 150 V at a temperature of from 5 to 50° C., preferably from 15 to 35° C., for about 5 to 60 seconds.

Also, if necessary, a treatment with an alkali silicate such as sodium silicate or hot water, or a dipping treatment in an aqueous solution of a water-soluble high molecular compound such as a resin having a cationic quaternary ammonium base or polyvinyl sulfonic acid, may be carried out.

A solvent used for a coating solution of the photopolymerizable composition to be coated on the support surface is not specially limited but should have a satisfactory solubility to the components to be used and provide satisfactory coating properties, examples of which include a cellosolve type solvent such as methyl cellosolve, ethyl cellosolve, methyl cellosolve acetate, ethyl cellosolve acetate or the like, a propylene glycol type solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate, dipropylene glycol dimethyl ether or the like, an ester type solvent such as butyl acetate, amyl acetate, ethyl butyrate, butyl butyrate, diethyl oxalate, ethyl pyruvate, ethyl-2-hydroxybutyrate, ethylacetoacetate, methyl lactate, ethyl lactate, methyl 3-methoxypropyonate or the like, an alcohol type solvent such as heptanol, hexanol, diacetone alcohol, furfuryl alcohol or the like, a ketone type solvent such as cyclohexanone, methyl amyl ketone or the like, a high polar solvent such as dimethylformamide, dimethylacetoamide, N-methylpyrrolidone or the like, or their mixture solvent, or further mixtures of aromatic hydrocarbons added thereto. An amount of a solvent used is usually from 1 to 20 times larger amount by weight to the total amount of a photopolymerizable composition.

Examples of the coating method include conventionally well known methods such as dip coating, spinner coating, spray coating, roll coating, coating with a coating rod or the like. A coated amount varies depending on its use but is such an amount as to provide a dry film thickness in a range of preferably from 0.1 to 10 g/m$^2$, more preferably from 0.5 to 5 g/m$^2$.

The photosensitive lithographic printing plate of the present invention preferably has an oxygen-shielding layer for preventing a polymerization-inhibiting function by oxygen to the photopolymerizable composition formed on the photosensitive layer of the photopolymerizable composition formed on the support surface as described above. However, an oxygen-shielding layer is not an essential element but an optional element in the present invention.

The component for constituting the oxygen-shielding layer is a polymer soluble in water or a mixture solvent of water with a water-miscible organic solvent such as an alcohol including methanol, ethanol, propanol, isononyl alcohol or the like or tetrahydrofuran or the like, and examples of the polymer include polyvinyl alcohol and its partially acetal-formed product, its cation-modified product with a quaternary ammonium salt or the like, a derivative of an anion-modified product with sodium sulfonate or the like, polyvinyl pyrrolidone, polyethylene oxide, methyl cellulose, carboxymethyl cellulose, hydroxyethyl cellulose, hydroxypropyl cellulose, gelatin, gum arabic, methylvinylether-maleic anhydride copolymer, polyacrylic acid ester-partially saponified product, and other copolymers of copolymerizable components such as a hydroxyl group-containing compound including hydroxyethyl(meth)acrylamide or the like, a carboxyl group-containing compound including an unsaturated carboxylic acid and its derivative including itaconic acid, (meth)acrylic acid, vinyl pyrrolidone or the like.

Among them, a polyvinyl alcohol and its derivatives are preferable in view of oxygen-shielding properties, and a product having a saponification value of from 70 to 99 mol %, preferably from 85 to 95 mol %, and a weight average molecular weight of from 2.0 to 500,000, preferably from 0.4 to 100,000, is preferable.

Further, in view of adhesion properties to a photosensitive layer, it is preferable to contain a vinyl pyrrolidone type polymer such as polyvinyl pyrrolidone, vinyl pyrrolidone-vinyl acetate copolymer or the like, an acrylic polymer emulsion, a diisocyanate compound, p-toluene sulfonic acid, hydroxy acetic acid or the like, in an amount of from 0.1 to 60 parts by weight, preferably from 1 to 50 parts by weight, to 100 parts by weight of the polyvinyl alcohol and its derivatives.

Still further, in view of preservation properties, it is preferable to contain an organic acid such as succinic acid, an organic acid salt such as ethylene diaminetetraacetic acid or the like, and also a nonionic surfactant such as polyoxyethylene alkyl phenyl ether or the like, an anionic surfactant such as sodium dodecylbenzenesulfonate or the like, a cationic surfactant such as alkyltrimethyl ammonium chloride, or the like, a defoaming agent, a dye, a plasticizer, a pH regulator or the like, in an amount of at most 10 parts by weight to 100 parts by weight of the polyvinyl alcohol and its derivatives.

The oxygen-shielding layer is coated in the same manner as in the coating method of the photosensitive layer by using water or a solution of a mixture solvent of water with a water-miscible organic solvent, and its coated amount is so as to provide a dry film thickness in a range of preferably from 1 to 10 $g/m^2$, more preferably from 1.5 to 7 $g/m^2$.

A method for forming an image in the present invention is carried out by subjecting the photosensitive layer of the photosensitive lithographic printing plate to scanning exposure with a laser light having a wavelength range of from 650 to 1,300 nm, developing the image, and then subjecting the whole surface to post-exposure.

A light source of the laser exposure is not specially limited, examples of which include a semiconductor laser of 830 nm, a YAG laser of 1,064 nm or the like.

Also, examples of a developer used in the development include an alkali developer comprising an aqueous solution containing from 0.1 to 10 wt % of an inorganic alkali salt such as sodium silicate, potassium silicate, lithium silicate, ammonium silicate, sodium metasilicate, potassium metasilicate, sodium hydroxide, potassium hydroxide, lithium hydroxide, sodium carbonate, sodium hydrogencarbonate, potassium carbonate, dibasic sodium phosphate, tribasic sodium phosphate, dibasic ammonium phosphate, tribasic ammonium phosphate, sodium borate, potassium borate, ammonium borate or the like, or an organic amine compound such as monomethylamine, dimethylamine, trimethylamine, monoethylamine, diethylamine, triethylamine, monoisopropylamine, diisopropylamine, monobutylamine, monoethanolamine, diethanolamine, triethanolamine, monoisopropanolamine, diisopropanolamine or the like.

Further, in order to improve an image quality or to reduce a development time, the developer may further contain a nonionic surfactant such as polyoxyethylene alkyl ethers, polyoxyethylene alkylaryl ethers, polyoxyethylene alkyl esters, sorbitan alkyl esters, monoglyceride alkyl esters or the like, an anionic surfactant such as alkylbenzene sulfonates, alkylnaphthalene sulfonates, alkyl sulfates, alkyl sulfonates, sulfosuccinic acid ester salts or the like, an amphoteric surfactant such as alkylbetaines, amino acids or the like, and a water-soluble organic solvent such as isopropyl alcohol, benzyl alcohol, ethyl cellosolve, butyl cellosolve, phenyl cellosolve, propylene glycol, diacetone alcohol or the like. The developer preferably has a pH of from 9 to 14.

The development is carried out by well known developing methods including dipping development, spray development, brush development, ultrasonic development or the like, usually at a temperature of from 10 to 60° C., preferably from 15 to 45° C. for from 5 seconds to 10 minutes. At this time, the oxygen-shielding layer may be previously removed by water or the like, or mainly removed at the time of development.

After the developing treatment, it is essential for the image-forming method of the present invention to carry out the whole image exposure with an exposure energy of at most 70 times, preferably at most 30 times, more preferably at most 25 times, particularly preferably at most 20 times, most preferably at most 15 times larger than that of the scanning exposure with the laser light. On the other hand, the lower limit of the whole image exposure energy is at least 1 time, preferably at least 1.2 times, more preferably at least 1.5 times, most preferably at least 2 times larger than that of the scanning exposure. If the whole image exposure is not carried out, or if the whole image exposure is carried out at an exposure energy of 70 times larger than that of the scanning exposure with the laser light, an image strength having a satisfactory printing resistance can not be obtained.

An exposure energy of the whole image exposure is not specially limited, provided that the above relation between the whole image exposure energy and the exposure energy of the scanning exposure is satisfied, but in view of rationalization of the image-forming step, it is preferable to carry out the whole image exposure with an exposure energy in a range of from 10 $mJ/cm^2$ to 10 $J/cm^2$ preferably from 20 $mJ/cm^2$ to 9 $J/cm^2$, more preferably from 50 $MJ/cm^2$ to 8 $J/cm^2$.

A light source of the whole image exposure is not specially limited, examples of which include a carbon arc, a high pressure mercury lamp, an ultra-high pressure mercury lamp, a low pressure mercury lamp, a deep UV lamp, a xenon lamp, a metal halide lamp, a fluorescent lamp, a tungsten lamp, a halogen lamp, an excimer laser lamp or the like, and a light having a wavelength of from 200 to 1,100 nm is used. Among them, a mercury lamp and a metal halide lamp are preferable, and a mercury lamp is particularly preferable.

The whole image exposure process may be carried out either by stopping an image or by continuously moving an image, and in view of an image strength, it is preferable to provide a light intensity in a range of from 10 $mW/cm^2$ to 1 $W/cm^2$, preferably from 15 $mW/cm^2$ to 700 $mW/cm^2$, more preferably from 25 $mW/cm^2$ to 500 $mW/cm^2$, on the image-forming surface. In order to make a light intensity in the above-mentioned range on the image-forming surface as mentioned above, it can be made by an exposure method of raising an output (W) of a light source by enhancing an output of a light source used or by enhancing an output per unit length in case of using a rod-like light source, or by an exposure method of making a light source closer to the image-forming surface.

Also, at the time of the whole image exposure, it is preferable to raise a temperature of the image-forming surface to a temperature of from 20 to 300° C., preferably from 23 to 250° C., more preferably from 40 to 200° C., by heating with a radiation heat from a light source of the whole image exposure or by heating with a hot plate, a drier, a ceramic heater or the like. As a heating means, it is convenient and preferable to employ a radiation heat from a light source. This operation is preferable for further improving a printing resistance.

Figure 1:
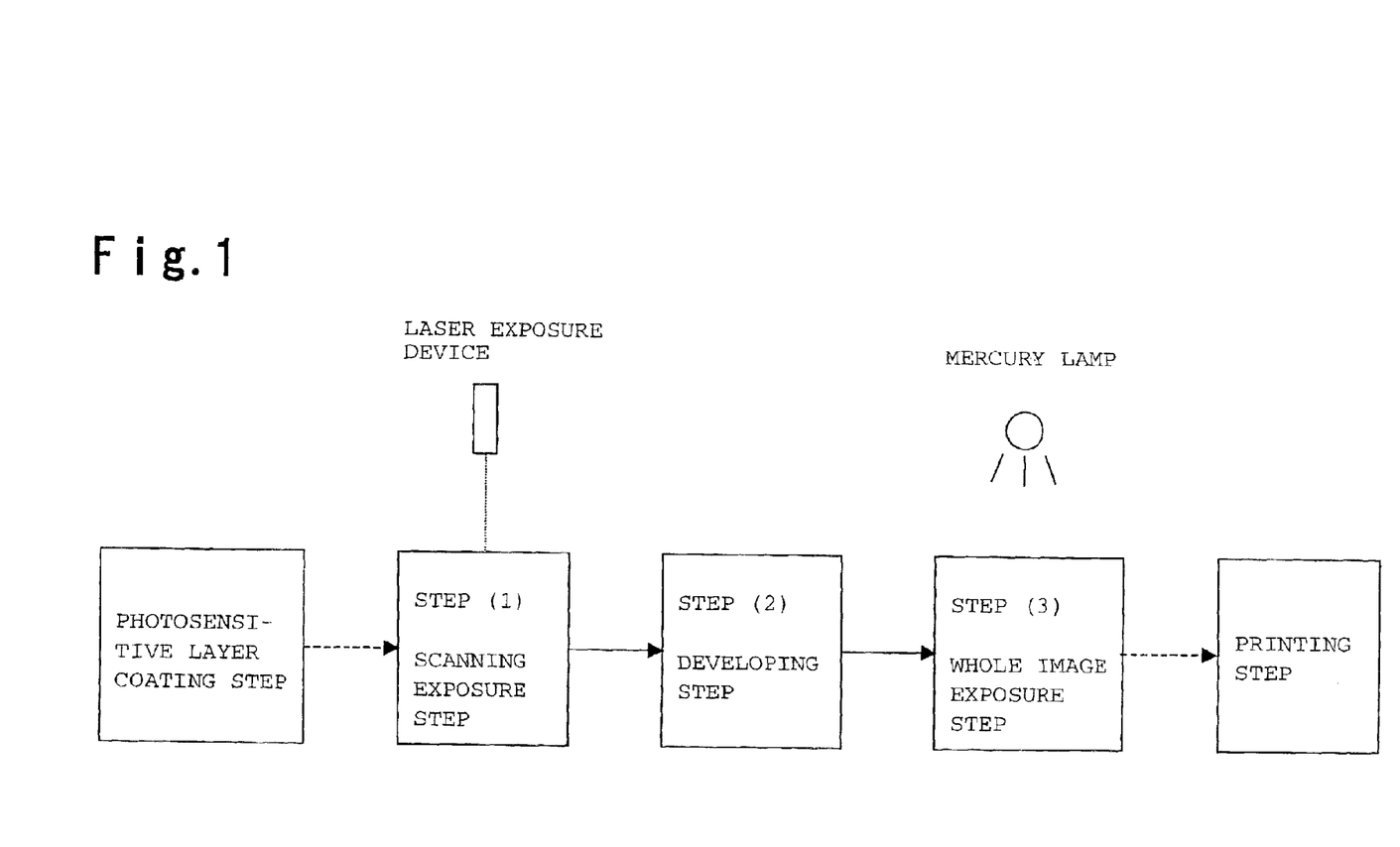
FIG. 1 is an image-forming apparatus.

Also, in the present invention, in order to carry out the above-mentioned image-forming process, such an image-forming apparatus continuously connecting the following steps as illustrated in FIG. 1 can be used.

(1) a scanning exposure step of subjecting a photosensitive layer comprising a photopolymerizable composition formed on a support surface of a photosensitive lithographic printing plate to scanning exposure with a laser light having a wavelength range of from 650 to 1,300 nm, (2) a developing step of developing an image of the photosensitive lithographic printing plate after the scanning exposure step, and (3) a whole image exposure step of subjecting the photosensitive lithographic printing plate after the developing step to whole image exposure with an exposure energy of from 1 to 70 times larger than that of the scanning exposure with the laser light used in the above step (1).

The image-forming apparatus of the present invention may comprise connecting separate apparatuses of respective steps (1) to (3) or may comprise connecting an apparatus of the step (3) with an apparatus comprising conventionally known steps (1) and (2).

Preferable conditions of respective steps may be the above-mentioned conditions in the image-forming process.

EXAMPLES

Hereinafter, the present invention is further illustrated with reference to Examples, but should not be limited thereto.

Examples 1 to 2 and Comparative Examples 1 to 2

A photosensitive lithographic printing plate was produced by preparing a coating solution obtained by dissolving the following ethylenic unsaturated compound of component (A), sensitizing dye of component (B), photopolymerization initiator of component (C), high molecular binder of component (D) and other components in a mixture solvent of propylene glycol monomethyl ether acetate/methoxypropanol (weight ratio 1/9) so as to provide a concentration of 8.5 wt %, coating the coating solution on the following aluminum plate support surface by a bar coater so as to provide a dry film thickness of 2 g/m², drying to form a photosensitive layer comprising the photopolymerizable composition, and further coating a mixed aqueous solution of polyvinyl alcohol/polyvinyl pyrrolidone (weight ratio 5/5) thereon by a bar coater so as to provide a dry film thickness of 3 g/m², and drying to form an oxygen-shielding layer.

Support

An aluminum plate support was obtained by degreasing an aluminum plate (thickness 0.24 mm) with a 3 wt % sodium hydroxide aqueous solution, electrolytically etching the degreased aluminum plate in a nitric acid bath of 18 g/l at 25° C., at an electric current density of 90 A/dm² for 11 seconds, further subjecting the electrolytically etched aluminum plate to desmut treatment in a 4.5 wt % sodium hydroxide aqueous solution at 30° C. for 2 seconds, neutralizing the treated aluminum plate with a 10 wt % nitric acid aqueous solution at 25° C. for 5 seconds, washing with water, subjecting the washed aluminum plate to anodizing treatment in a 30 wt % sulfuric acid bath at 30° C., at an electric current density of 10 A/dm² for 16 seconds, washing with water, and drying.

(A) Ethylenic Unsaturated Compound

The following compound (A-1): 22 parts by weight

The following compound (A-2): 22 parts by weight

The following compound (A-3): 11 parts by weight (B) Sensitizing Dye

The following compound (B-1): 1.2 parts by weight (C) Photopolymerization Initiator 2-(p-methoxyphenyl)-4,6-bis(trichloromethyl)-s-triazine: 5 parts by weight (D) High Molecular Binder Reaction product (acid value 53, 50 mol % of carboxyl group of methacrylic acid component reacted) obtained by reacting 3,4-epoxycyclohexylmethyl acrylate with methyl methacrylate (80 mol %)/methacrylic acid (20 mol %) copolymer (weight average molecular weight: 500,000): 45 parts by weight Other Components Pigment (ethyl violet): 7.5 parts by weight Surfactant ("Emulgen 104P", manufactured by Kao Corp.): 2 parts by weight Surfactant ("S-381", manufactured by Asahi Glass Company, Limited): 0.3 part by weight Each of the photosensitive lithographic printing plates obtained above was treated by subjecting to laser scanning exposure with a 830 nm laser irradiating apparatus ("Trendsetter", manufactured by Creo Company) under conditions as shown in the following Table 1, removing an oxygen-shielding layer by washing with water, and then developing by dipping the above treated printing plate in a developer comprising an aqueous solution containing 2 wt % of potassium silicate and 3.4 wt % of sodium alkylnaphthalenesulfonate (concentration 35 wt %, "Pelex NBL", manufactured by Kao Corp.) at 30° C. for about 20 seconds, and rubbing the printing plate with a sponge one time. The printing plate thus developed was coated with a gum solution ("CTP Plus Finisher", manufactured by Western-Lithotic Company) and was dried.

The printing plate thus treated was subjected to whole image exposure by using a high pressure mercury lamp exposure apparatus equipped with a conveyor under such conditions as to provide an exposure amount and a light intensity on the image-forming surface shown in the following Table 1 by changing the position of a lamp house with a cold mirror using a 125 W/cm high pressure mercury lamp (manufactured by I Graphics Company) from 15 to 50 cm apart from the printing plate surface and changing a conveyor speed. The image-forming surface was heated by a radiation heat from the mercury lamp to a temperature of from 40 to 70° C. The respective light exposure amounts and light intensities were measured by "UVPZ-1", manufactured by I Graphics Company.

After the whole image exposure, a printing resistance of each lithographic printing plate was evaluated by measuring a remaining rate of 1% small dots of 175 lines at the time when printing 80,000 sheets of papers, and the results are shown in the following Table 1.

Evaluation symbol mark ○: small dots remained without any defect.

Evaluation symbol mark Δ: a part of small dots disappeared but the majority remained.

Evaluation symbol mark X: substantially all of small dots disappeared.

shown in the following Table 2 by changing a conveyor speed. The image-forming surface was heated by a radiation heat from the mercury lamp to a temperature of 25° C. The respective light exposure amounts and light intensities were measured by "UVPZ-1", manufactured by I Graphics Company.

The results are shown in the following Table 2.

TABLE 2

| | Laser scanning exposure | | Whole image exposure | | | |
|---|---|---|---|---|---|---|
| | Wavelength (nm) | Exposure amount (X) (mJ/cm$^2$) | Exposure amount (Y) (mJ/cm$^2$) | Y/X | Light intensity (mW/cm$^2$) | Printing resistance |
| Example 3 | 830 | 80 | 300 | 3.8 | 20 | ○ |
| Example 4 | 830 | 80 | 500 | 6.3 | 20 | ○ |

According to the present invention, a sufficient image strength having a satisfactory printing resistance can be provided when an image is formed by subjecting a photopolymerizable photosensitive lithographic printing plate to an infrared laser light exposure, and an image-forming method excellent also in reproducibility of an image can be provided.

The entire disclosure of Japanese Patent Application No. 2001-77682 filed on Mar. 19, 2001 including specification, claims, drawings and summary are incorporated herein by reference in its entirety.

What is claimed is:

1. A method for forming an image, comprising:
   exposing a photosensitive layer of a photosensitive lithographic printing plate to a laser light having a wavelength in a range of from 650 to 1,300 nm to conduct laser light scanning exposure, said photosensitive layer comprising a photopolymerizable composition formed

TABLE 1

| | Laser scanning exposure | | Whole image exposure | | | |
|---|---|---|---|---|---|---|
| | Wavelength (nm) | Exposure amount (X) (mJ/cm$^2$) | Exposure amount (Y) (mJ/cm$^2$) | Y/X | Light intensity (mW/cm$^2$) | Printing resistance |
| Example 1 | 830 | 80 | 300 | 3.8 | ≦110 | ○ |
| Example 2 | 830 | 80 | 150 | 1.9 | ≦110 | ○ |
| Comparative Example 1 | 830 | 80 | Without whole image exposure | — | — | X |
| Comparative Example 2 | 830 | 80 | 8,000 | 100 | ≦110 | —*1 |

*1: A clear image could not be obtained because of fusion of a gum solution.

Examples 3 to 4

Photosensitive printing plates were prepared and exposed to light, and were subjected to a test for evaluating a printing resistance, in the same manner as in Example 1, except that the printing plates were subjected to whole image exposure by using a low pressure mercury lamp exposure apparatus (Ster-L-Ray G48T6L manufactured by Atlantic Ultraviolet Co., Ltd.) under such conditions as to provide an exposure amount and a light intensity on the image-forming surface on a support surface of the photosensitive lithographic printing plate;
developing an image; and
subjecting the photosensitive lithographic printing plate having a developed image to whole image exposure with a light exposure energy of from 1 to 70 times larger than the light exposure energy at the time of the laser light scanning exposure.

2. The method for forming an image according to claim 1, wherein the light exposure energy at the time of the whole image exposure is at most 50 times larger than the light exposure energy at the time of the laser light scanning exposure.

3. The method for forming an image according to claim 2, wherein the light exposure energy at the time of the whole image exposure is from 1.2 to 30 times larger than the light exposure energy at the time of the laser light scanning exposure.

4. The method for forming an image according to claim 3, wherein the light exposure energy at the time of the whole image exposure is from 1.5 to 25 times larger than the light exposure energy at the time of the laser light scanning exposure.

5. The method for forming an image according to claim 1, wherein a light intensity on an image-forming surface of the photosensitive lithographic printing plate at the time of the whole image exposure is at least 10 mW/cm$^2$.

6. The method for forming an image according to claim 5, wherein the light intensity on the image-forming surface at the time of the whole image exposure is from 15 to 700 mW/cm$^2$.

7. The method for forming an image according to claim 1, wherein a temperature of on an image-forming surface of the photosensitive lithographic printing plate at the time of the whole image exposure is from 20 to 300° C.

8. The method for forming an image according to claim 1, wherein a light source of the whole image exposure is a mercury lamp.

9. The method for forming an image according to claim 1, wherein a light exposure energy at the time of the whole image exposure is from 10 mJ/cm$^2$ to 10 J/cm$^2$.

10. The method for forming an image according to claim 1, wherein the photopolymerizable composition of the photosensitive layer contains the following components (A) to (D):

(A) an ethylenic unsaturated compound, (B) a sensitizing dye absorbing a light having a wavelength in a range of from 650 to 1,300 nm, (C) a photopolymerization initiator, and (D) a high molecular binder.

11. The method for forming an image according to claim 10, wherein the component (B) is cyanine type dyes.

12. The method for forming an image according to claim 10, wherein the component (C) is triazine compounds or organic borates.

13. The method for forming an image according to claim 10, wherein the respective components (A), (B), (C) and (D) of the photopolymerizable composition are in a weight ratio of (A):(B):(C):(D)=100:0.01–20:0.1–80:10–400.

14. The method for forming an image according to claim 1, wherein an oxygen-shielding layer is formed on the photosensitive layer.

* * * * *